US010608588B2

(12) United States Patent
Wei et al.

(10) Patent No.: US 10,608,588 B2
(45) Date of Patent: Mar. 31, 2020

(54) AMPLIFIERS AND RELATED INTEGRATED CIRCUITS

(71) Applicant: NXP USA, Inc., Austin, TX (US)

(72) Inventors: Yun Wei, Chandler, AZ (US); Monte Miller, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/854,034

(22) Filed: Dec. 26, 2017

(65) Prior Publication Data

US 2019/0199289 A1 Jun. 27, 2019

(51) Int. Cl.
| | | |
|---|---|---|
| H03F 1/22 | (2006.01) | |
| H03F 1/02 | (2006.01) | |
| H03F 3/195 | (2006.01) | |
| H01L 23/66 | (2006.01) | |
| H01L 29/20 | (2006.01) | |
| H03F 3/30 | (2006.01) | |

(52) U.S. Cl.
CPC ........... H03F 1/0205 (2013.01); H01L 23/66 (2013.01); H01L 29/2003 (2013.01); H03F 1/223 (2013.01); H03F 3/195 (2013.01); H03F 3/30 (2013.01); H01L 2223/665 (2013.01); H01L 2223/6616 (2013.01); H03F 2200/153 (2013.01); H03F 2200/451 (2013.01); H03F 2200/61 (2013.01); H03F 2200/72 (2013.01)

(58) Field of Classification Search
CPC .......................................................... H03F 1/22
USPC .................................................. 330/311, 310
See application file for complete search history.

(56) References Cited

U.S. PATENT DOCUMENTS 2,043,267 A * 6/1936 Moran .................... A01N 65/00
514/70
4,473,780 A * 9/1984 Gent ......................... H03F 1/42
315/382

(Continued)

FOREIGN PATENT DOCUMENTS

EP 1424771 A1 6/2014

OTHER PUBLICATIONS

Ezzeddine, A.K. et al. "The high voltage/high power FET (HiVP)", IEEE Radio Frequency Integrated Circuits (RFIC) Symposium, pp. 215-218 (2003).

(Continued)

*Primary Examiner* — Henry Choe
(74) *Attorney, Agent, or Firm* — Bruce M. Green

(57) ABSTRACT

Embodiments of an amplifiers and integrated circuits include a first transistor and a second transistor. A second current-carrying terminal of the first transistor may be coupled to a first current-carrying terminal of the second transistor and the control terminal of the second transistor may be coupled to a low impedance alternating current (AC) potential node. A bias network that includes a first circuit element and a second circuit element couples the second current-carrying terminal of the second transistor to the control terminal of the second transistor. The first circuit element may be configured to apply a portion of a potential at the second current-carrying terminal of the second transistor to the control terminal of the second transistor, and the second circuit element may be coupled between the control terminal of the second transistor and a fixed potential.

21 Claims, 6 Drawing Sheets

(56) References Cited

U.S. PATENT DOCUMENTS

| | | | | |
|---|---|---|---|---|
| 4,940,949 | A * | 7/1990 | Landi | H03F 1/22 330/262 |
| 6,208,210 | B1 * | 3/2001 | Bartola | H01L 23/66 330/286 |
| 6,496,069 | B1 * | 12/2002 | Van De Westerlo | H03F 1/226 330/276 |
| 6,515,547 | B2 | 2/2003 | Sowlati | |
| 6,724,270 | B2 * | 4/2004 | Kozu | H03B 5/1231 330/311 |
| 7,710,202 | B2 * | 5/2010 | Shiikuma | H03F 1/0288 330/124 R |
| 7,843,269 | B2 * | 11/2010 | Chen | H03F 1/0288 330/124 R |
| 8,076,994 | B2 * | 12/2011 | Farrell | H01L 23/66 330/302 |
| 8,111,104 | B2 * | 2/2012 | Ahadian | H03F 1/301 330/290 |
| 8,319,561 | B2 * | 11/2012 | Venugopal | H03F 1/223 257/215 |
| 8,766,714 | B2 * | 7/2014 | Kaehs | H01L 23/645 330/269 |
| 2003/0048138 | A1 * | 3/2003 | Van De Westerlo | H03F 1/22 330/311 |
| 2009/0045878 | A1 * | 2/2009 | Shiikuma | H03F 1/0288 330/295 |
| 2010/0271135 | A1 | 10/2010 | Afsahi | |
| 2014/0339432 | A1 * | 11/2014 | Sekine | H03F 3/16 250/366 |
| 2016/0190994 | A1 * | 6/2016 | Shi | H03G 3/30 330/290 |

OTHER PUBLICATIONS

Sowlati, T. et al. "A 2.4-GHz 0.18-μm CMOS self-biased cascade power amplifier", IEEE Journal of Solid-State Circuits, vol. 38, No. 8, pp. 1318-1324 (Aug. 2003).

Jeong, et al. "Highly Linear SOI LDMOS Power Amplifier with Combinated Cascode Structure", EEE Radio Frequency Integrated Circuits (RFIC) Symposium, pp. 215-218 (2016).

Kobayashi, K.W., et al, "Multi-Decade GaN HEMT Cascode-Distributed Power Amplifier with baseband Performance," 2009 IEEE Radio Frequency Integrated Circuits Symposium.

Green, B.M., et al, High-Power Broad-Band AlGaN/GaN HEMT MMICs on SiC Substrates, IEEE Transactions on Microwave Theory and Techniques, vol. 49, No. 12, Dec. 2001.

Green, B.M., et al, "Cascode Connected AlGaN/GaN HEMT's on SiC Substrates,", IIEEE Microwave and Guided Wave Letters, vol. 10, No. 8, Aug. 2000.

Peterson, K.E.,et al, "Monolithic High-Voltage FET Power Ahplifiers," 1989 IEEE International Microwave Symposium Digest, p. 948-951.

Ezzeddine, A., et al, "High-Voltage FET Amplifiers for Satellite and Phased-Array Applications," 1985 IEEE International Microwave Symposium Digest, p. 336-339.

Moon, J.S., et al, ">70% Power-Added-Efficiency Dual-Gate, Cascode GaN HEMTs Without Harmonic Tuning," IEEE Electron Device Letters, vol. 37, No. 3, March 2016, p. 272-274.

Martin, A. et al. "Design of GaN-based balanced cascode cells for wide-band distributed power amplifier", 2007 European Microwave Integrated Circuit Conference, Munich, pp. 154-157 (2007&.

Jeong, et al. "A 20 dBm Linear RF Power Amplifier Using Stacked Silicon-on-Sapphire MOSFETs", IEEE Microwave and Wireless Components Letters, vol. 16, No. 12, Dec. 2006, pp. 684-686.

* cited by examiner

AMPLIFIERS AND RELATED INTEGRATED CIRCUITS

TECHNICAL FIELD

Embodiments of the subject matter described herein relate generally to RF amplifiers and integrated circuits.

BACKGROUND

Many RF power amplifier applications require high voltage, high power, wide bandwidth operation. The high breakdown voltage and current density of group III-nitride (N) (e.g. gallium nitride (GaN)) transistor technology enables such high voltage, high power, wide bandwidth operation. Such applications require stable, high gain operation at microwave frequencies. However, stability is often traded off in GaN or other power amplifier designs that provide high gain. Accordingly, there is a need for stable, high gain amplifier and integrated circuit structures amenable to GaN or other RF transistor technologies.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Figure 1:
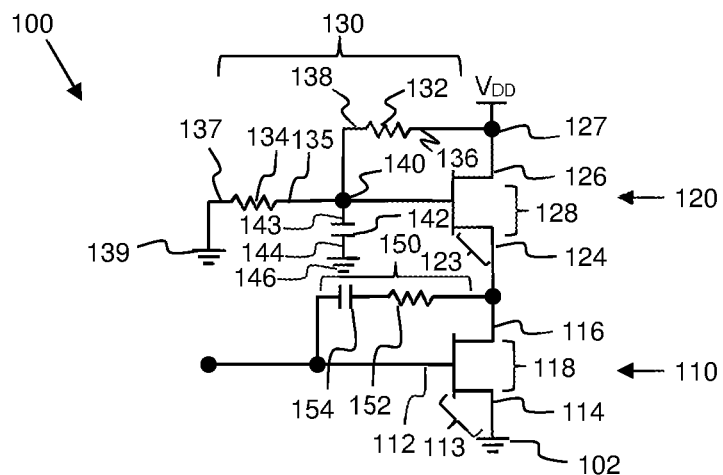
FIG. 1 is a schematic diagram of an amplifier in accordance with an example embodiment.

FIG. 1 is a schematic diagram of an amplifier, in accordance with an example embodiment. According to embodiment, the amplifier may include a first transistor 110, a second transistor 120 coupled to the first transistor 110, a bias network 130 coupled to the second transistor 120 and a feedback network 150 coupled to the first transistor 110.

According to an embodiment, the first transistor 110 and the second transistor 120 are the primary active components of the amplifier 100. The first transistor 110 may include a control terminal 112, a first current carrying terminal 114, and a second current-carrying terminal 116, where the current-carrying terminals are spatially and electrically separated by a variable-conductivity channel. Likewise, the second transistor 120 may include a control terminal 122, a first current carrying terminal 124, and a second current-carrying terminal 126, where the current-carrying terminals are spatially and electrically separated by a variable-conductivity channel. In an embodiment, the first transistor 110 and second transistor 120 may be field effect transistors (FET's) (such as heterojunction FET's (HFET's), metal-semiconductor FET's (MESFET's), or metal oxide semiconductor FET's (MOSFET's)), each of which include a gate (control terminal), a source (a first current-carrying terminal), and a drain (a second current-carrying terminal). For convenience of explanation and not for limitation, various embodiments of the invention will be illustrated using GaN HFET active devices, which are preferred. However, many other active device types may also be employed and are intended to be included within the scope of the invention, as for example and not intended to be limiting, bipolar devices, junction field effect devices, various insulated gate field effect devices, and so forth. Alternatively, the first transistor 110 and the second transistor 120 may be bipolar junction transistors (BJT's) or heterojunction BJT's (HBT's). Accordingly, references herein to a "gate," "drain," and "source," are not intended to be limiting, as each of these designations has analogous features for a bipolar device implementation (e.g., a base, collector, and emitter, respectively).

According to an embodiment, and using nomenclature typically applied to FET's in a non-limiting manner, the source terminal 114 (i.e. first current-carrying element) of the first transistor 110 may be coupled to a fixed potential 102 (e.g. a ground potential or a non-zero fixed voltage potential) in a common source configuration and the drain terminal 116 (i.e. second current-carrying element) of the first transistor 110 may be coupled to the source terminal 124 (i.e. first current-carrying element) of the second transistor 120. In an embodiment, the gate terminal 122 (i.e. control terminal) of the second transistor 120 may be coupled to a low impedance alternating current (AC) potential node 140 to place the transistor 120 in a common gate configuration. As used herein, the term "low impedance AC node" means a node that has an AC impedance at high frequencies (e.g. greater than 10 MHz) that is at least two times lower than a non-constant voltage source circuit element coupled to the low impedance AC node. As used herein, a constant voltage source circuit element refers to a voltage source or ground. In an embodiment, the low impedance AC node 140 may be coupled to a capacitor 142 that includes a first terminal 143 coupled to the gate terminal 122 of the second transistor 120 and a second terminal 144 coupled to a ground potential terminal 146 (i.e. fixed potential terminal). In other embodiments (not shown), the fixed potential terminal may include a positive or negative direct current (DC) constant potentials. As such, and in an embodiment, the first transistor 110 and second transistor 120 are cascode-coupled. In an embodiment, capacitor 142 may have values between about 0.2 picofarads and about 10 picofarads. In other embodiments, capacitor 142 may have values between about 0.1 picofarads and about 1000 picofarads. Without departing from the scope of the inventive subject matter, capacitor 142 may have other higher or lower capacitance values. As used herein, "cascode-coupled" describes an arrangement of two transistors, wherein the drain of a common source transistor (or common gate transistor) is coupled to the source of a common gate transistor. In an embodiment, cascode-coupled transistors may have lower gate-drain capacitance and, therefore, higher power gain than a single common source transistor. The higher gain occurs because a signal incident to the drain of the common gate transistor (e.g. second transistor 120) may be diverted to the low impedance created by low impedance AC node 140 since the gate-source capacitance of the common gate transistor may have a higher value than the gate-drain capacitance of the same common gate transistor. Thus, the reverse coupling between the drain terminal of the common gate device (e.g. second transistor 120) and the gate terminal of the common source device (e.g. first transistor 110) may be reduced and the gain of the cascode-coupled device may be improved compared to a stand-alone common source device (e.g. first transistor 110). In addition, cascode-coupled transistors may be operated at higher operating voltages and may have higher output impedance than common source transistors.

In an embodiment, a bias network 130 may include a first resistor 132 (i.e. first circuit element) and a second resistor 134 (i.e. second circuit element). The bias network 130 may be coupled to the gate terminal 122 and the drain terminal 126 of the second transistor 120. In an embodiment, a first terminal 136 of the first resistor 132 may be coupled to the drain terminal 126 of transistor 120 and a second terminal 138 of the first resistor 132 may be coupled to the gate terminal 122 of the second transistor 120 and the low impedance AC node 140. The second resistor 134 may include a first terminal 135 and second terminal 137, according to an embodiment. In an embodiment, the first terminal 135 may be coupled to the gate terminal 122 of the second transistor 120 and the second terminal 137 of the second resistor 134 may be coupled to a fixed potential 139. In an embodiment, the fixed potential 139 may include a ground potential (i.e. non-zero voltage). In other embodiments, the fixed potential may include a positive or negative voltage. In other embodiments (not shown), circuit elements other than resistors (e.g. inductors, capacitors, filters, and other circuit elements) may be used in addition to, or in place of, the first resistor 132 and the second resistor 134.

In an embodiment, a feedback network 150 may couple the gate terminal 112 of the first transistor 110 to the drain terminal 116 of the first transistor and the source terminal 124 of the second transistor. The feedback network 160 may be used to improve the stability or adjust the gain of the amplifier 100. The feedback network 150 may include a resistor 152 connected in series with a capacitor 154 (i.e. second circuit element). The feedback network 150 may be coupled to the gate terminal 122 and the drain terminal 126 of the second transistor 120. In other embodiments (not shown), inductors, filters, or other passive circuit elements may be added to the feedback network 150. In an example embodiment that includes first and second transistors 110 and 120 implemented with GaN transistors each having a gate length between 0.25 microns and 0.5 microns, and each having a total gate width of between 325 microns and 600 microns, the resistor 152 may have a value between about 1000 ohms and about 6000 ohms and the capacitor may have a value between about 0.5 picofarads and about 1.0 picofarads. In other embodiments, the resistor 152 may have a value between about 300 ohms and about 6K ohms and the capacitor 154 may have a value between about 0.5 picofarads and about 2 picofarads. Other embodiments may use higher or lower values of the resistor 152 and the capacitor 154 without departing from the scope of the inventive subject matter.

In an embodiment, the first transistor 110 and the second transistor 120 are biased in forward active operation. As used herein, "forward active operation" means that a transistor is biased such that a voltage between the drain and source of the device ($V_{DS}$) allows current conduction through a channel and so that a voltage between a gate terminal and source terminal of the device exceeds a threshold voltage to allow current flow through the channel and realize a non-zero small signal transconductance for the transistor. During operation, a drain bias potential 127 ($V_{DD}$) may be applied at the drain terminal 126 of the second transistor 120. Also, a first gate-source potential 113 ($V_{GS1}$) may be applied between the gate terminal 112 and source terminal 114 of the first transistor 110 and a second gate-source potential 123 ($V_{GS1}$) may be applied between the gate terminal 122 and source terminal 124 of the second transistor 120. A portion of $V_{DD}$ may be coupled to the gate terminal 122 of second transistor 120 according to the ratio of the resistances of the first resistor 132 and the second resistor 134. The DC drain-source voltage 118 across the first transistor 110 ($V_{DS1}$) and the value of the drain-source voltage 128 across the second transistor 120 ($V_{DS2}$) may be adjusted by appropriately selecting the values of the first resistor 132 and the second resistor 134. In an embodiment, the values of the first resistor 132 and second resistor, may be chosen such that $V_{DS1}$ and $V_{DS2}$ are equal. In this condition, $V_{GS2}=V_{DD}/2+V_{GS1}$. In other embodiments, first resistor 132 and the second resistor 134 may be chosen such that $V_{DS1}$ and $V_{DS2}$ are un-equal. In an example embodiment that includes GaN transistor realizations of first transistor 110 and second transistor 120, each having a gate length of between 0.25 microns and 0.5 microns, and each having a total gate width of between 325 microns and 600 microns, the first resistor 132 may have a value between about 10000 ohms and about 16000 ohms and the second resistor may have a value between about 10000 ohms and about 16000 ohms. In other embodiments, the first resistor 132 may have a value between about 10000 ohms and about 20000 ohms and the second resistor 134 may have a value between about 10000 ohms and about 20000 ohms. Other embodiments may use higher or lower values of first resistor 132 and second resistor 134 without departing from the scope of the inventive subject matter.

Figure 2:
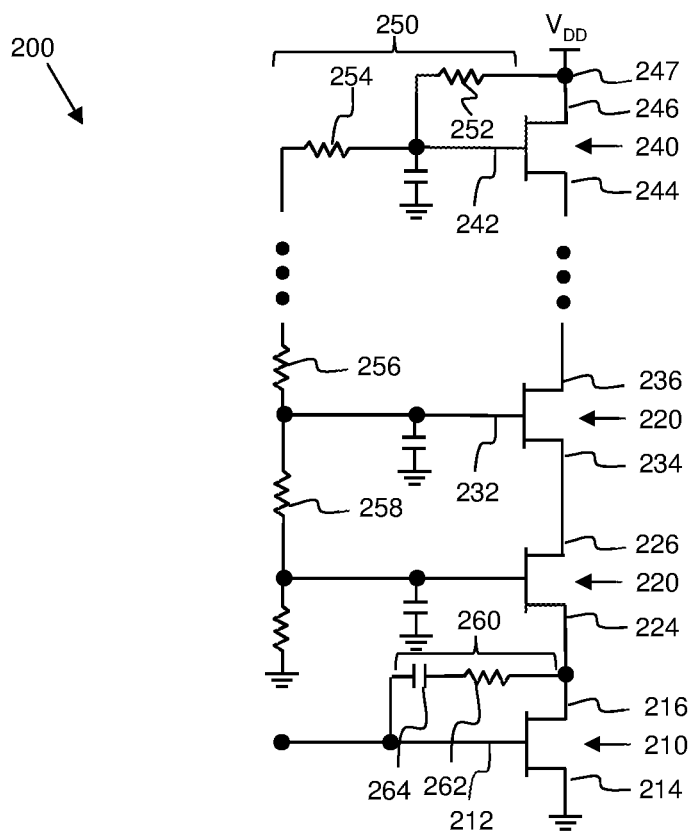
FIG. 2 is a schematic diagram of an amplifier in accordance with an example embodiment.

FIG. 2 is a schematic diagram of an amplifier 200 in accordance with an example embodiment. Analogous to the amplifier 100 of FIG. 1, the amplifier 200 includes a first transistor 210 in common-source configuration, cascode-coupled to the source of a second transistor 220 in common gate configuration, according to an embodiment. One or more additional transistors 230 and 240 in common gate configuration may be cascode-coupled to the drain terminal 226 of the second transistor 220, according to an embodiment. Each of transistors 230 and 240 include control terminals 232 and 242, source terminals 234 and 244, and drain terminals 236 and 246. In an embodiment, a final cascode-coupled transistor not coupled to the source of an adjacent cascode-coupled transistor, (e.g. the drain terminal 246 of transistor 240), may be coupled to a constant drain potential (e.g. a drain supply voltage 244, $V_{DD}$). In an embodiment, a bias network 250 may be coupled to the one or more additional transistors (e.g. transistors 230 and 240). In an embodiment, the bias network 250 includes a first resistor 252 coupled to the drain terminal 246 of the transistor 240, a second resistor 254 coupled to the gate terminal 242 of the transistor 240. In addition, the bias network 250 may contain additional resistors (e.g. resistors 256 and 258) for each additional transistor in addition to the transistor that terminates at the drain potential 247, according to an embodiment. Analogous to the amplifier 100 of FIG. 1, and in an embodiment, a feedback network 260 (e.g. a series connected resistor 262 and capacitor 264) may couple the gate terminal 212 of the first transistor 210 to the drain terminal 216 of the first transistor 210 and the source terminal 224 of the second transistor.

Figure 3:
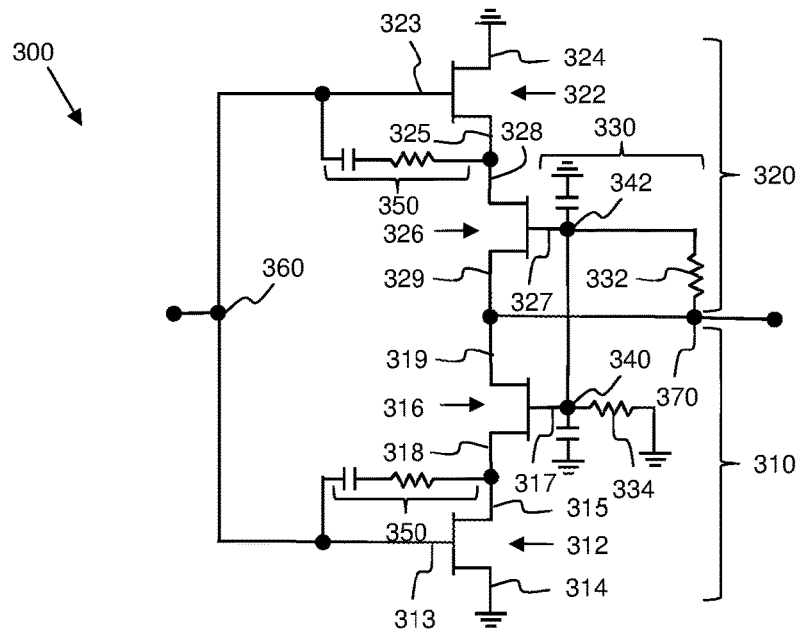
FIG. 3 is a schematic diagram of an amplifier in accordance with an example embodiment.

FIG. 3 is a schematic diagram of an amplifier 300 in accordance with an example embodiment. In an embodiment, the amplifier 100 of FIG. 1 may be arranged in an amplifier 300. Amplifier 300 may be configured as a unit cell (i.e. cell). In an embodiment, the unit cell amplifier 300 may include a first sub-cell 310 and a second sub-cell 320 coupled to the first sub-cell 310, a bias network 330 coupled to the first sub-cell 310 and the second sub-cell 320. Feedback networks 350 may be coupled to each of the first sub-cell 310 and the second sub-cell 320.

The first sub-cell 310 may include first and second transistors 312 and 316 having gate terminals 313 and 317 (i.e. control terminals), source terminals 314 and 318 (i.e. first current-carrying terminals), and drain terminals 315 and 319 (i.e. second current-carrying terminals), according to an embodiment. Likewise, in an embodiment, the second sub-cell 320 may include third and fourth transistors 322 and 326 having gate terminals 323 and 327 (i.e. control terminals), source terminals 324 and 328 (i.e. first current-carrying terminals), and drain terminals 325 and 329 (i.e. second current-carrying terminals).

In an embodiment, the gate terminals 313 and 323 of the first and third transistors 312 and 322 may be coupled at a first gate connection node 360. The drain terminals 319 and 329 of the second and fourth transistors 316 and 326 may be coupled at a drain connection node 370, according to an embodiment. The gate terminals 317 and 327 of the second and fourth transistors 316 and 326 may be coupled at a second gate connection node 342, in an embodiment. The source terminals 314 and 324 of the first and third transistors 312 and 322 may be coupled to a ground potential (i.e. a fixed potential). The second gate connection node 342 may be coupled to the low impedance AC node 340, according to an embodiment. The low impedance AC node 340 has analogous components and is arranged as the low impedance AC node 140 of FIG. 1. Likewise, the feedback networks 350 may couple the gates 313 and 323 and drains 315 and 324 of the first and third transistors 312 and 322 analogous to the connection of the feedback network to the first transistor 110 of FIG. 1.

In an embodiment, the bias network 330 may include a first resistor 332 (i.e. first circuit element) and a second resistor 334 (i.e. second circuit element), according to an embodiment. In an embodiment, the first resistor 332 and may couple the drain connection node 370 to the second gate connection node 342. The second resistor 334 may couple the second gate connection node to a ground potential (i.e. a fixed potential).

Figure 4:
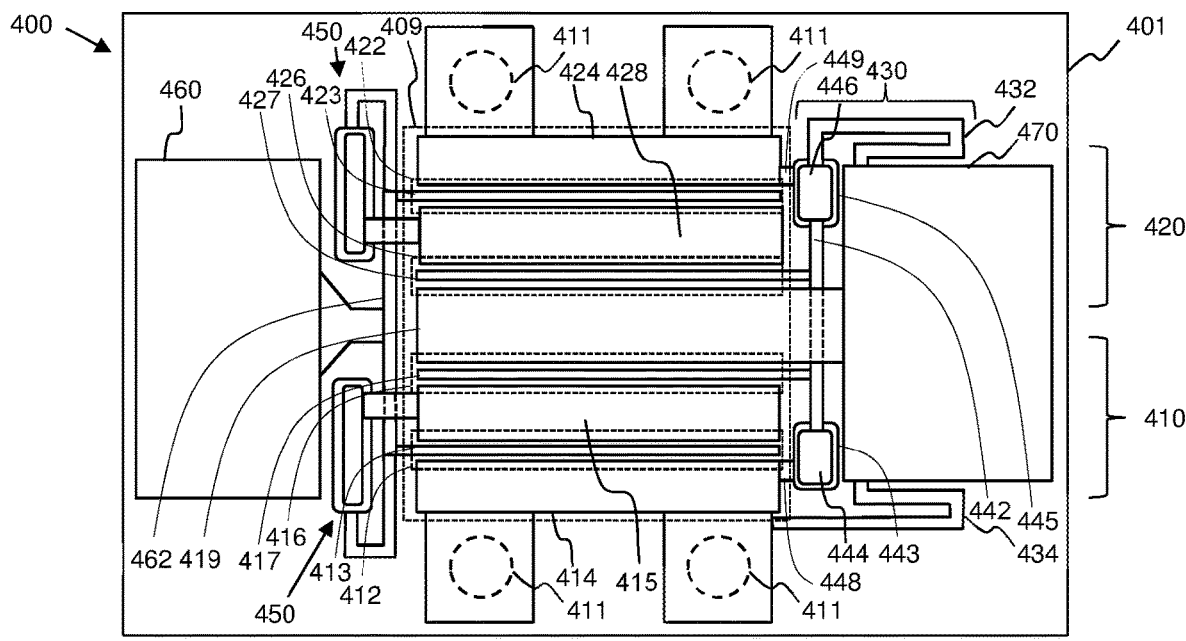
FIG. 4 is a top-down, plan view of an integrated circuit, in accordance with an example embodiment.

FIG. 4 is a top-down, plan view of an integrated circuit 400, in accordance with an example embodiment. As used herein, the term "integrated circuit" is defined to mean active and/or passive circuit elements formed together monolithically on a common substrate. In an embodiment, the integrated circuit 400 may be a physical realization of the unit cell amplifier 300 of FIG. 3 and includes a semiconductor substrate 401, an active area 409, a first sub-cell 410 and a second sub-cell 420 that is coupled to the first sub-cell 410.

In an embodiment, the integrated circuit 400 may include a first sub-cell 410 and a second sub-cell 420 adjacent to and coupled to the first sub-cell 410. The first sub-cell 410 may include first and second transistors 412 and 416 having gate electrodes 413 and 417 (i.e. control terminals), source electrode 414, source-drain electrode 415 (i.e. first current-carrying terminals), and shared drain electrode 419 (i.e. second current-carrying terminals), according to an embodiment. According to an embodiment, the source-drain electrode 415 serves as both the drain of the first transistor 412 as well as the source of the second transistor 416. Thus, the source-drain electrode is both a second current-carrying element and a first current-carrying electrode, according to an embodiment. In an embodiment, the first transistor 412 may be formed directly adjacent to the second transistor 416. As used herein, the term "directly adjacent" means that two elements are adjacent and there are no intervening elements between the two adjacent elements. Likewise, the second sub-cell 420 may include third and fourth transistors 422 and 426 having gate electrodes 423 and 427 (i.e. control terminals), source electrodes 424 and 428 (i.e. first current-carrying terminals), and drain electrode 425 and shared drain electrode 419 (i.e. second current-carrying terminals). In an embodiment, the third transistor 422 may be formed directly adjacent the fourth transistor 426.

In an embodiment, the gate electrodes 413 and 423 of the first and third transistors 412 and 422 may be coupled to a first gate pad 460 via a first gate bus 462. The common drain electrode 419 of the second and fourth transistors 416 and 426 may be coupled to a drain pad 470, according to an embodiment. The gate electrodes 417 and 427 of the second and fourth transistors 416 and 426 may be coupled to the second gate connection bus 442, in an embodiment. The second gate connection bus 442 may be coupled to first and second capacitors 443 and 445. In an embodiment, first and second capacitors 443 and 445 may be realized as metal-insulator-metal (MIM) capacitors with top plates 444 and 446. The top plates 444 and 446 may act as a low impedance AC node coupled to source electrodes 414 and 424 (i.e. fixed potentials) of first and third transistors 412 and 422 via source connections 448 and 449, according to an embodiment. The source electrodes 414 and 424 of the first and third transistors 412 and 422 may be coupled to a ground potential (i.e. a fixed potential) using source vias 411. Source vias 411 may be realized as through wafer vias, according to an embodiment. Feedback networks 450 may couple the gate electrodes 413 and 423 and first and second drain to source connections 415 and 425 of the first and third transistors 412 and 422, analogous to the connection of the feedback network to the first transistor 110 of FIG. 1.

In an embodiment, the bias network 430 includes a first resistor 432 (i.e. first circuit element) and a second resistor 434 (i.e. second circuit element), according to an embodiment. In an embodiment, the first resistor 432 may couple the drain pad 470 to the second gate connection bus 442. The second resistor 434 may couple the second gate bus 442 to a ground potential (i.e. a fixed potential) via the lower plate of the capacitor 446 coupled to the $1^{st}$ sub-cell 610.

Figure 5:
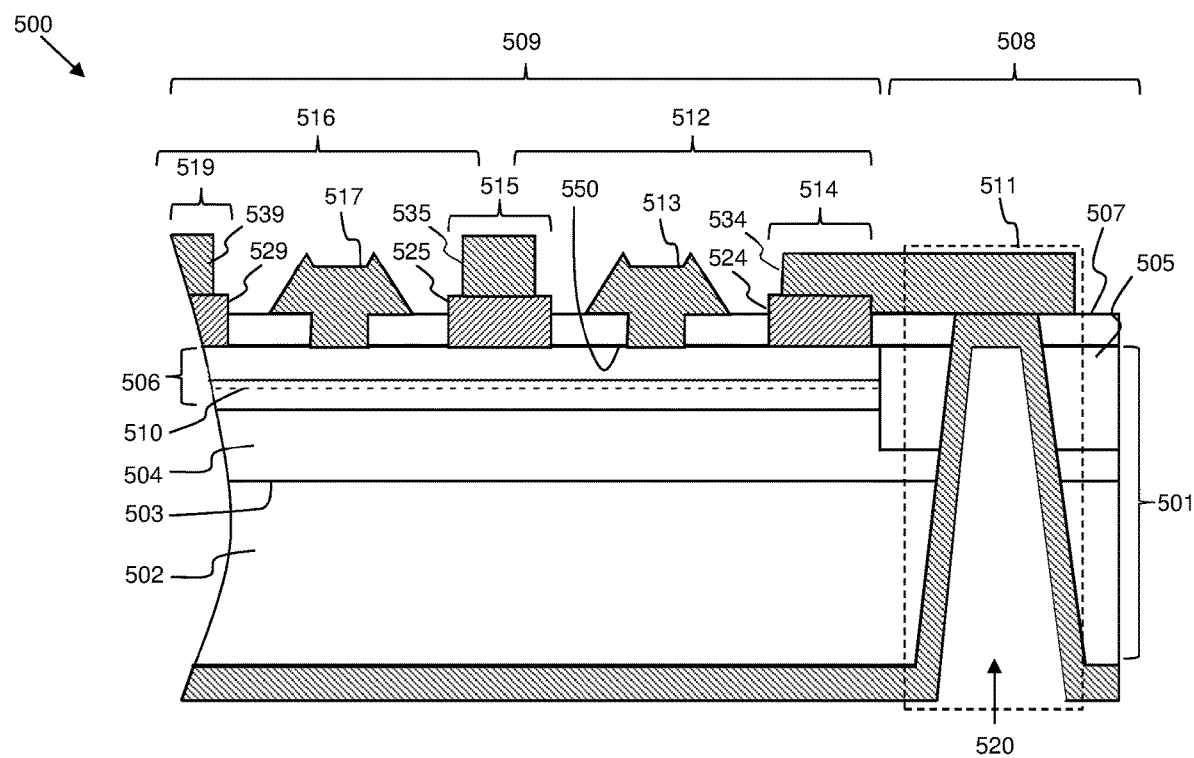
FIG. 5 is a cross-sectional, side view of an integrated circuit, in accordance with an example embodiment.

FIG. 5 is a cross-sectional, side view of an integrated circuit 400 along a partial cut line 5-5 of FIG. 4. In an embodiment, the integrated circuit 500 may include a semiconductor substrate 501, an isolation area 508, an active area 509, a first transistor 512 formed within the active area 509, a second transistor 516 formed adjacent the first transistor 512.

In an embodiment, the semiconductor substrate 501 includes an upper surface 550 and may include a host substrate 502, a buffer layer 504 disposed over the host substrate 502, and a channel/barrier layer 506 disposed over the buffer layer 504. In an embodiment, the host substrate 502 includes an upper surface 503. In an embodiment, the host substrate 502 may include silicon carbide (SiC). In other embodiments, the host substrate 502 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials. A nucleation layer (not shown) may be grown over the host substrate as a first layer. The buffer layer 504 may be formed over the upper surface of the host substrate 502 and may include a number of group III-N semiconductor layers. Each of the semiconductor layers of the buffer layer 504 may include an epitaxially grown group III-nitride eptiaxial layer. The group-III nitride epitaxially layers that make up the buffer layer 104 may be nitrogen (N)-face or gallium (Ga)-face material, for example. In other embodiments, the semiconductor layers of the buffer layer 504 may not be epitaxially grown. In still other embodiments, the semiconductor layers of the buffer layer 504 may include Si, GaAs, InP, or other suitable materials. In an embodiment, the channel/barrier layer 506 may be formed over the buffer layer 504. Like the buffer layer 504, the channel/barrier layer 506 may include a number of group III-N semiconductor layers and may be supported by the buffer layer 504. Each of the semiconductor layers of the channel/barrier layer 506 may include an epitaxially grown group III-N eptiaxial layer. The group III-N epitaxially layers that make up the channel/barrier layer 506 may be nitrogen (N)-face or gallium (Ga)-face material, for example. In an embodiment, the channel barrier layer may include an AlGaN layer comprising an Al mole fraction between 20 and 25% disposed over a GaN channel layer. In other embodiments, the semiconductor layers of the channel/barrier layer 506 may not be epitaxially grown. In still other embodiments, the semiconductor layers of the channel/barrier layer 506 may include Si, GaAs, InP, or other suitable materials. In an embodiment, the channel/barrier layer 506 may be formed over the buffer layer 504. In an embodiment, a channel 510 providing electrons for current flow through first and second transistors 512 and 516 may be formed in the channel/buffer layer.

One or more isolation region(s) 508 may be formed in the semiconductor substrate 501 to define an active region 509 above and along the upper surface 503 of the host substrate 502, according to an embodiment. The isolation regions 508 may be formed via an implantation procedure configured to damage the epitaxial and/or other semiconductor layers to create high resistivity regions 505 of the semiconductor substrate 501 rendering the semiconductor substrate 501 high resistivity or semi-insulating in those high resistivity regions 505 while leaving the crystal structure intact in the active region 509. In other embodiments, the isolation regions 508 may be formed by removing one or more of the epitaxial and/or other semiconductor layers of the semiconductor substrate 501 rendering the remaining layers of the semiconductor substrate 501 semi-insulating and leaving behind active region 509 "mesas" surrounded by high resistivity or semi-insulating isolation regions 505. In an embodiment, a dielectric layer 507 may be formed over the active region 509 and isolation regions 508. In an embodiment, the dielectric layer 507 may be formed from one or more suitable materials including silicon dioxide ($SiO_2$), silicon nitride (SiN), silicon oxynitride (SiON), aluminum oxide ($Al_2O_3$), aluminum nitride (AlN), and hafnium oxide ($HfO_2$), though other substantially insulating materials may be used.

An embodiment of the inventive subject matter may include first and second transistors 512 and 516 having gate electrodes 513 and 517 (i.e. control terminals), source electrode 514 (i.e. first current-carrying terminal), drain electrode 519, and drain-source electrode 515 (i.e. second current-carrying terminals), according to an embodiment. In an embodiment, the first transistor 512 may be formed directly adjacent to the second transistor 516. In an embodiment, the gate electrodes 513 and 517 may be formed from a multi-layer stack (not shown) that includes a Schottky layer (e.g. one of nickel, platinum, or palladium) overlain by a conductive layer (e.g. one or more of gold, palladium, platinum, or aluminum) In an embodiment, the source electrode 514, the source-drain electrode 515, and the drain electrode 519 may include a bottom ohmic contact metal portions 524, 525, and 529 that makes an ohmic contact with the channel within the channel/barrier layer. The ohmic contact metal portions 524, 525, and 529 may be overlain by top metal portions 534, 535, and 539. In an embodiment, the ohmic contact metal portions may include one or more of titanium, aluminum, nickel, molybdenum, platinum, and gold. In an embodiment, the top metal layer portions may include one or more of titanium, nickel, platinum, and gold. In an embodiment, a source via 511 may be used to couple the source electrode 514 of the first transistor to a ground (i.e. a fixed potential). The source via 511 includes a through wafer via 520 lined with back-metal layer 521. The back-metal layer terminates on a source connection 522. Without departing from the scope of the inventive subject matter, it should be appreciated that additional embodiments may contain additional metal layers and dielectrics layers needed to provide passive components (e.g. capacitors, inductors, transmission lines, etc.), connectivity, environmental protection, and functionality required in the application.

Figure 6:
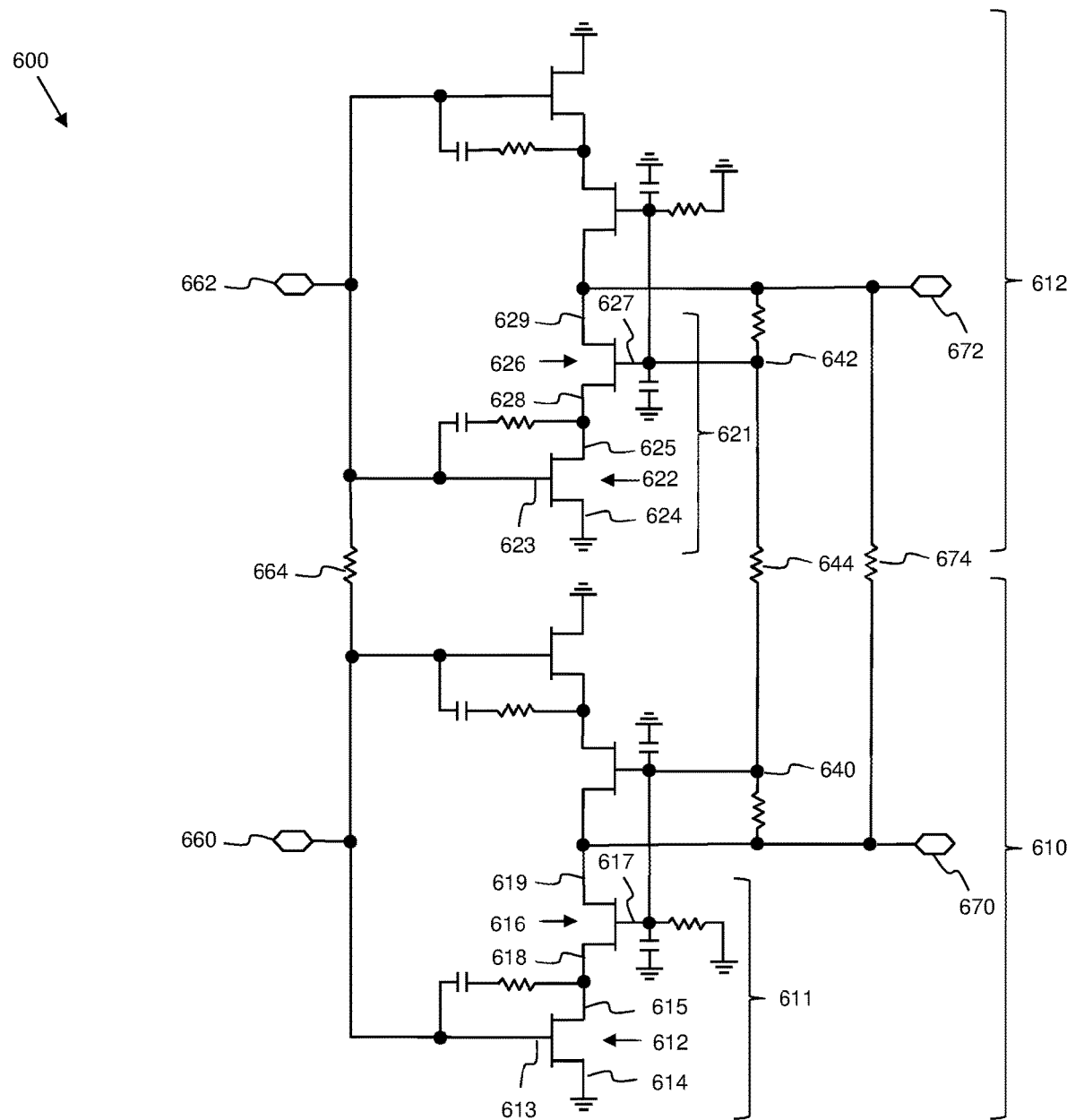
FIG. 6 is a schematic diagram of an amplifier in accordance with an example embodiment.

FIG. 6 is a schematic diagram of an amplifier 600 in accordance with an example embodiment. In an embodiment, the amplifier 300 of FIG. 3 may be arranged as two or more unit cell amplifiers (i.e. cells) coupled together. In an embodiment, the amplifier 600 may include a first cell 610 and a second cell 620 coupled to the first cell 610.

The first cell 610 may include first sub-cell 611. Sub-cell 611 may include first and second transistors 612 and 616 having gate terminals 613 and 617 (i.e. control terminals), source terminals 614 and 618 (i.e. first current-carrying terminals), and drain terminals 615 and 619 (i.e. second current-carrying terminals), according to an embodiment. Likewise, in an embodiment, the second cell 620 may include a first sub-cell 621. In an embodiment, the first sub-cell 621 may include third and fourth transistors 622 and 626 having gate terminals 623 and 627 (i.e. control terminals), source terminals 624 and 628 (i.e. first current-carrying terminals), and drain terminals 625 and 629 (i.e. second current-carrying terminals). In an embodiment, the gate terminal 613 of the first transistor may be coupled to the gate terminal 623 of the third transistor. In an embodiment, the drain terminal 619 of the second transistor may be coupled to the drain terminal 629 of the fourth transistor. In an embodiment, the control terminal 617 of the second transistor may be coupled to the control terminal 627 of the fourth transistor.

In some embodiments, resistors may be used to couple the first cell to the second cell to suppress oscillations (e.g. odd-mode oscillations) between first and second gate connections 660 and 662, first and second drain connections 670 and 672, as well as between first and second low impedance AC nodes 640 and 642. These odd-mode oscillations may arise due to loop gains caused by circuit imbalances between the various components in the amplifier. To this end, and in an embodiment, a first gate odd-mode suppression resistor 664 (i.e. a resistor) may be used to couple the first and second gate connections 660 and 662 (i.e. the gate terminal 613 of the first transistor and the gate terminal 623 of the third transistor). According to an embodiment, a drain odd-mode suppression resistor 674 (i.e. a resistor) may be used to couple drain connections 670 and 672 (i.e. the drain terminal 619 of the second transistor to the drain terminal 629 of the fourth transistor). Likewise, and in an embodiment, a second gate odd-mode suppression resistor 644 (i.e. a resistor) may be used to couple the first and second low impedance AC nodes (i.e. the gate terminal 617 of the second transistor to the gate terminal 627 of the fourth transistor).

Figure 7:
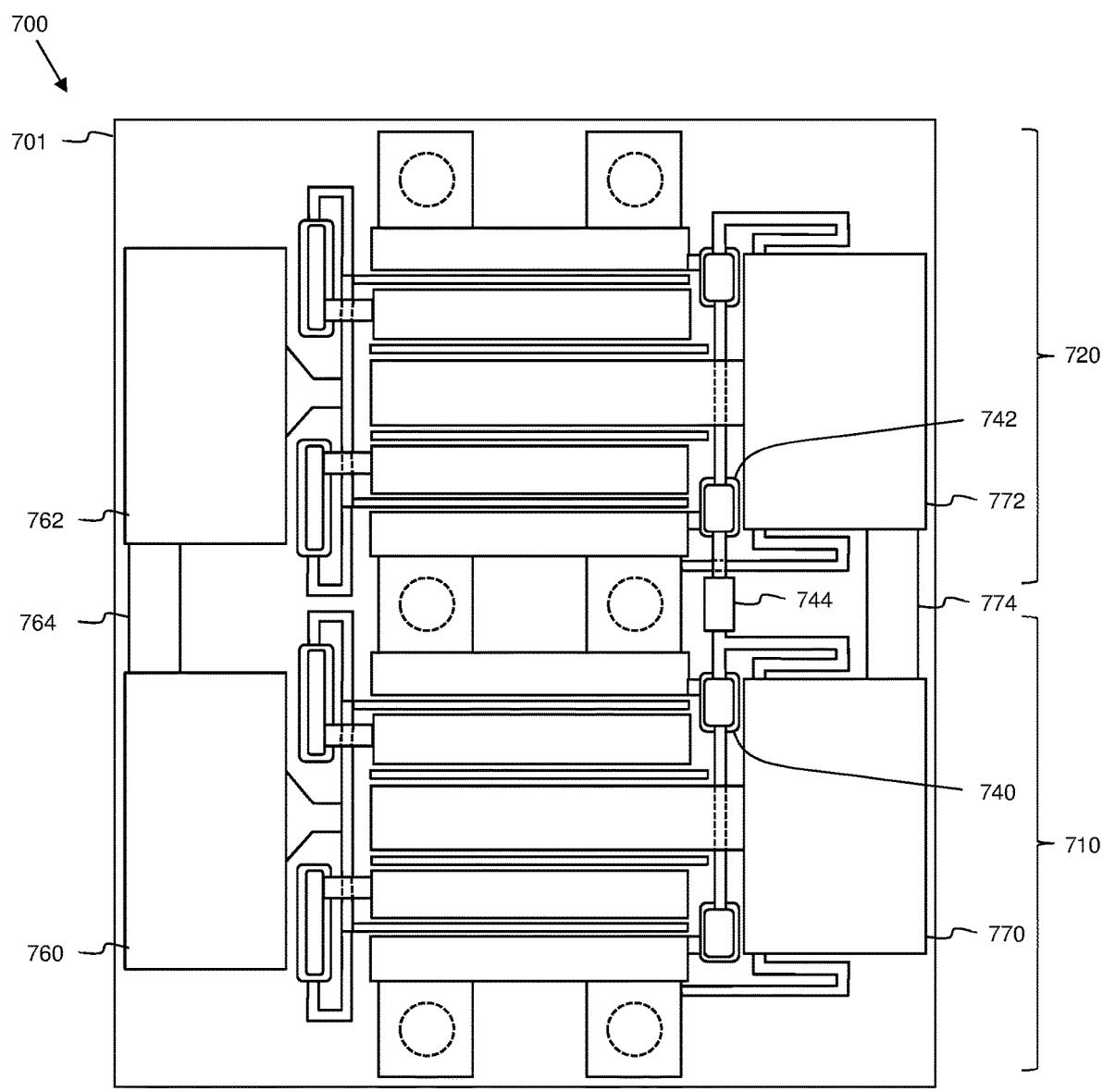
FIG. 7 is a top-down, plan view of an integrated circuit, in accordance with an example embodiment.

FIG. 7 is a top-down, plan view of an integrated circuit 700, in accordance with an example embodiment. The integrated circuit 700 is a physical realization of the amplifier 600 of FIG. 6. The integrated circuit 700 includes a semiconductor substrate 701, a first unit cell 710 (i.e. first cell) formed over the semiconductor substrate 701, and a second unit cell 720 (i.e. second cell) formed adjacent to and coupled to the first unit cell 710.

In an embodiment, the first and second unit cells 710 and 720 include first gate pads 760 and 762, drain pads 770 and 772, and low impedance AC connections 740 and 742. Analogous to the schematic representation of the integrated circuit 700, described in connection with the amplifier 600 of FIG. 6, odd-mode suppression resistors may be used between first gate, pads 760 and 762, drain pads 770 and 772, and low impedance AC connections 740 and 742 (i.e. low impedance AC nodes). In an embodiment, a first gate odd-mode suppression resistor 764 may be used to couple first gate pads 760 and 762. A drain odd-mode suppression resistor 774 may be used to couple first drain pads 770 and 772, according to an embodiment. In an embodiment, a second gate odd-mode suppression resistor 744 may be used to couple low impedance AC connections 740 and 742.

Figure 8:
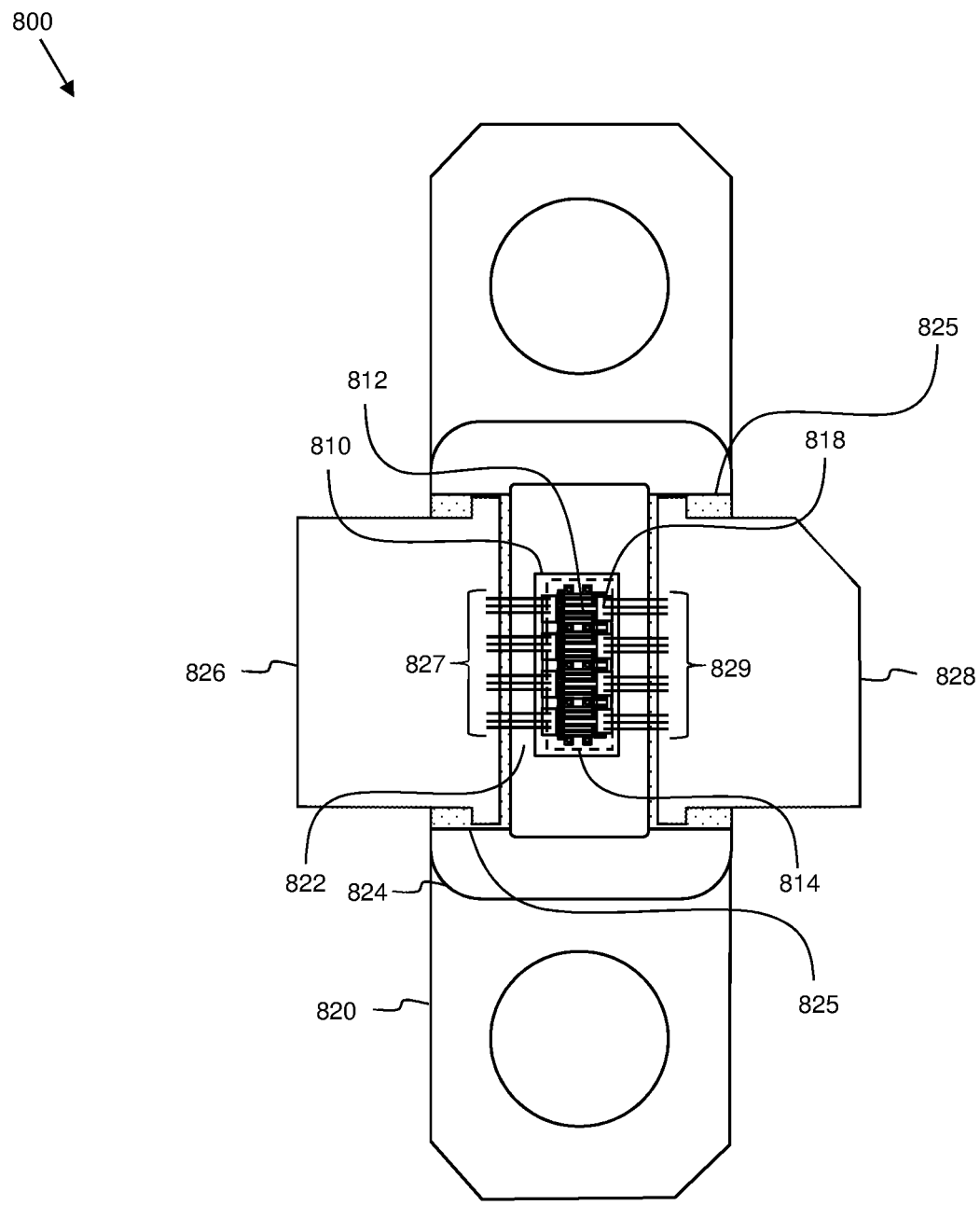
FIG. 8 is a top-down, plan view of an apparatus that includes a package, in accordance with an example embodiment.

FIG. 8 is a top-down, plan view of an apparatus 800, in accordance with an example embodiment. According to an embodiment, the apparatus 800 may include an amplifier 810 coupled to a package 820. In an embodiment, the amplifier 810 includes a substrate 812, a plurality of unit cells 814 formed over the substrate, and gate pads 816 and drain pads 818 coupled to the plurality of unit cells 814. In an embodiment, the amplifier has a structure and function analogous to the amplifier 600 of FIG. 6 and the integrated circuit 700 of FIG. 7. In an embodiment, the package 820 includes a flange 822, a lead frame 824, supported by the flange 822, insulating material 825 supported by the lead frame 824, an input terminal 826 and an output terminal 828 supported by the insulating material 825. In an embodiment, the substrate 812 may be coupled to the flange 822. According to an embodiment, the gate pads 816 may be electrically isolated from the lead frame 824 by the insulating material 825 and coupled to the input terminal input 826 using an input wire bond array 827. Likewise, the drain pads 818 may be electrically isolated from the lead frame 824 by the insulating material 825 and may be coupled to the output terminal 828 using an output wire bond array 829. Without departing from the scope of the inventive subject matter, it should be appreciated that other amplifier and package configurations may be used in other embodiments. For example, the amplifier 810 may be packaged in a flip chip or wafer-level packaging configuration.

Various embodiments of amplifiers and related integrated circuits have been described herein. According to an embodiment, an amplifier may include a first transistor that includes a first current-carrying terminal, a second current-carrying terminal, and a control terminal. An embodiment may include a second transistor that includes a first current-carrying terminal, a second current-carrying terminal, and a control terminal. In an embodiment, the second current-carrying terminal of the first transistor may be coupled to the first current-carrying terminal of the second transistor and the control terminal of the second transistor may be coupled to a low impedance alternating current (AC) potential node. An embodiment may also include a bias network that includes a first circuit element and a second circuit element. The first circuit element may couple the second current-carrying terminal of the second transistor to the control terminal of the second transistor, in an embodiment. The first circuit element may be configured to apply a portion of a potential at the second current-carrying terminal of the second transistor to the control terminal of the second transistor, according to an embodiment. In an embodiment, the second circuit element may be coupled between the control terminal of the second transistor and a fixed potential.

Another embodiment of the inventive subject matter may include an apparatus that includes a substrate. An embodiment may include a first transistor formed in the substrate that includes a first source terminal, a first drain terminal, and a first gate terminal. An embodiment may further include a second transistor formed in the substrate that includes a second source terminal, a second drain terminal, and a second gate terminal. In an embodiment, the second source terminal may be coupled to the first drain terminal and the second gate terminal may be coupled to a low impedance alternating current (AC) potential node. An embodiment may include a bias network that includes a first circuit element and a second circuit element. The first circuit element may couple the second drain terminal to the second gate terminal, according to an embodiment. In an embodiment, the first circuit element may be configured to apply a portion of a potential at the second drain terminal to the second gate terminal. In an embodiment, the second circuit element may be coupled between the second gate terminal and a fixed potential. In an embodiment, a feedback network may include a resistor and a capacitor connected in series to the resistor. The feedback network may couple the first gate terminal to the first drain terminal and to the second source terminal, according to an embodiment.

Further embodiments of the inventive subject matter include integrated circuits. In an embodiment, an integrated circuit may include a semiconductor substrate that includes an upper surface and a channel. In an embodiment, a source electrode may be disposed over the semiconductor substrate, coupled to the channel, and disposed along the upper surface of the semiconductor substrate. An embodiment may include a first gate electrode disposed over the semiconductor substrate directly adjacent the source electrode. a connection electrode disposed over the semiconductor substrate, coupled to the channel, and directly adjacent the first gate electrode. In an embodiment, the first gate may between the source electrode and the connection electrode. A second gate electrode may be disposed over the semiconductor substrate and directly adjacent the connection electrode, wherein the second gate electrode is coupled to a low impedance alternating current (AC) potential node. An embodiment may include a first resistor formed over the semiconductor substrate. The first resistor may couple the second drain electrode to the second gate electrode, according to an embodiment. An embodiment may further include a second resistor formed over the semiconductor substrate. The second resistor may couple the second gate electrode to a fixed potential terminal.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier comprising:
   a first transistor that includes a first current-carrying terminal, a second current-carrying terminal, and a control terminal;
   a second transistor that includes a first current-carrying terminal, a second current-carrying terminal, and a control terminal, wherein the second current-carrying terminal of the first transistor is coupled to the first current-carrying terminal of the second transistor and the control terminal of the second transistor is coupled to a low impedance alternating current (AC) node;
   a bias network that includes a first circuit element and a second circuit element, wherein the first circuit element couples the second current-carrying terminal of the second transistor to the control terminal of the second transistor with a direct current (DC) coupling, wherein the first circuit element is configured to apply a portion of a potential at the second current-carrying terminal of the second transistor to the control terminal of the second transistor, and wherein the second circuit element is coupled between the control terminal of the second transistor and a fixed potential; and
   a feedback network that directly connects the control terminal of the first transistor to the second current-carrying terminal of the first transistor and the first current-carrying terminal of the second transistor.

2. The amplifier of claim 1, wherein the first transistor and the second transistor are configured as field effect transistors, and wherein the first current-carrying terminals are configured as source terminals, the second current-carrying terminals are configured as drain terminals, and the control terminals are configured as gate terminals.

3. The amplifier of claim 1, wherein the feedback network includes a resistor and a capacitor connected in series to the resistor.

4. The amplifier of claim 1, wherein the low impedance AC node is coupled to a first terminal of a capacitor, and wherein a second terminal of the capacitor is coupled to a fixed potential.

5. The amplifier of claim 1, wherein the first circuit element includes a first bias resistor, and the second circuit element includes a second bias resistor.

6. An amplifier comprising:
   a first transistor that includes a first current-carrying terminal, a second current-carrying terminal, and a control terminal;
   a second transistor that includes a first current-carrying terminal, a second current-carrying terminal, and a control terminal, wherein the second current-carrying terminal of the first transistor is coupled to the first current-carrying terminal of the second transistor and the control terminal of the second transistor is coupled to a low impedance alternating current (AC) node;
   a bias network that includes a first circuit element and a second circuit element, wherein the first circuit element couples the second current-carrying terminal of the second transistor to the control terminal of the second transistor, wherein the first circuit element is configured to apply a portion of a potential at the second current-carrying terminal of the second transistor to the control terminal of the second transistor, and wherein the second circuit element is coupled between the control terminal of the second transistor and a fixed potential;
   wherein the first circuit element includes a first bias resistor, and the second circuit element includes a second bias resistor; and
   wherein, during operation, the first bias resistor and the second bias resistor create a first bias voltage between the second current-carrying terminal of the first transistor and the first current-carrying terminal of the first transistor, and create a second bias voltage between the second current-carrying terminal of the second transistor and the first current-carrying terminal of the second transistor, and wherein during operation, the first bias voltage and the second bias voltage are equal.

7. An amplifier comprising:
   a first transistor that includes a first current-carrying terminal, a second current-carrying terminal, and a control terminal;
   a second transistor that includes a first current-carrying terminal, a second current-carrying terminal, and a control terminal, wherein the second current-carrying terminal of the first transistor is coupled to the first current-carrying terminal of the second transistor and the control terminal of the second transistor is coupled to a low impedance alternating current (AC) node;
a bias network that includes a first circuit element and a second circuit element, wherein the first circuit element couples the second current-carrying terminal of the second transistor to the control terminal of the second transistor, wherein the first circuit element is configured to apply a portion of a potential at the second current-carrying terminal of the second transistor to the control terminal of the second transistor, and wherein the second circuit element is coupled between the control terminal of the second transistor and a fixed potential;
wherein the first circuit element includes a first bias resistor, and the second circuit element includes a second bias resistor; and
wherein, during operation, the first bias resistor and the second bias resistor create a first bias voltage between the second current-carrying terminal of the first transistor and the first current-carrying terminal of the second transistor, and create a second bias voltage between the second current-carrying terminal of the second transistor and the first current-carrying terminal of the second transistor, and wherein during operation, the first bias voltage and the second bias voltage are un-equal.

8. The amplifier of claim 5, wherein the first bias resistor and the second bias resistor are selected such that, during operation, the first transistor and the second transistor are biased in a forward-active mode of operation.

9. The amplifier of claim 1 further comprising one or more additional transistors, wherein each of the one or more additional transistors includes a first current-carrying terminal, a second current-carrying terminal, and a control terminal, and wherein each of the one or more additional transistors are cascode-coupled to the second transistor or to another one of the additional transistors.

10. An amplifier comprising:
a first transistor that includes a first current-carrying terminal, a second current-carrying terminal, and a control terminal;
a second transistor that includes a first current-carrying terminal, a second current-carrying terminal, and a control terminal, wherein the second current-carrying terminal of the first transistor is coupled to the first current-carrying terminal of the second transistor and the control terminal of the second transistor is coupled to a low impedance alternating current (AC) node;
a bias network that includes a first circuit element and a second circuit element, wherein the first circuit element couples the second current-carrying terminal of the second transistor to the control terminal of the second transistor, wherein the first circuit element is configured to apply a portion of a potential at the second current-carrying terminal of the second transistor to the control terminal of the second transistor, and wherein the second circuit element is coupled between the control terminal of the second transistor and a fixed potential; and
wherein the amplifier comprises a plurality of cells including at least a first cell and a second cell, wherein the first transistor and the second transistor are included in a portion of the first cell, wherein a third transistor and a fourth transistor are included in a portion of the second cell, wherein the control terminal of the first transistor is coupled to a control terminal of the third transistor, wherein the second current-carrying terminal of the second transistor is coupled to a second current-carrying terminal of the fourth transistor, and wherein the control terminal of the second transistor is coupled to a control terminal of the fourth transistor.

11. The amplifier of claim 10, wherein a resistor couples the control terminal of the first transistor to the control terminal of the third transistor.

12. The amplifier of claim 11, wherein a resistor couples the second current-carrying terminal of the second transistor to the second current-carrying terminal of the fourth transistor.

13. The amplifier of claim 11, wherein a resistor couples the control terminal of the second transistor to the control terminal of the fourth transistor.

14. An apparatus comprising:
a substrate;
a first transistor formed in the substrate that includes a first source terminal, a first drain terminal, and a first gate terminal;
a second transistor formed in the substrate that includes a second source terminal, a second drain terminal, and a second gate terminal, and wherein the second source terminal is coupled to the first drain terminal and the second gate terminal is coupled to a low impedance alternating current (AC) potential node;
a bias network that includes a first circuit element and a second circuit element, wherein the first circuit element couples the second drain terminal to the second gate terminal with a direct current (DC) coupling, and wherein the first circuit element is configured to apply a portion of a potential at the second drain terminal to the second gate terminal, and wherein the second circuit element is coupled between the second gate terminal and a fixed potential; and
a feedback network comprising a resistor and a capacitor connected in series to the resistor, wherein the feedback network directly connects the first gate terminal to the first drain terminal and to the second source terminal.

15. The apparatus of claim 14 further comprising:
an electronic package that includes a flange, an input terminal, and an output terminal, wherein the flange is coupled to the substrate, the input terminal is coupled to the first gate terminal, and the output terminal is coupled to the second drain terminal.

16. The amplifier of claim 14, wherein the low impedance AC node is coupled to a first terminal of a capacitor, and wherein a second terminal of the capacitor is coupled to a fixed potential.

17. An integrated circuit comprising:
a semiconductor substrate that includes an upper surface and a channel;
a source electrode disposed over the semiconductor substrate, coupled to the channel, and disposed along the upper surface of the semiconductor substrate;
a first gate electrode disposed over the semiconductor substrate directly adjacent the source electrode;
a connection electrode disposed over the semiconductor substrate, coupled to the channel, and directly adjacent the first gate electrode, wherein the first gate is between the source electrode and the connection electrode;
a second gate electrode disposed over the semiconductor substrate and directly adjacent the connection electrode, wherein the second gate electrode is coupled to a low impedance alternating current (AC) potential node;
a second drain electrode disposed over the semiconductor substrate, coupled to the channel, and directly adjacent the second gate electrode, wherein the second gate electrode is between the connection electrode and the second drain electrode;
a first resistor formed over the semiconductor substrate, wherein the first resistor couples the second drain electrode to the second gate electrode; and
a second resistor formed over the semiconductor substrate, wherein the second resistor couples the second gate electrode to a fixed potential terminal.

18. The integrated circuit of claim 17, further comprising:
a feedback network disposed over the semiconductor substrate, wherein the feedback network couples the first gate terminal to the first drain terminal and to the second source terminal.

19. The integrated circuit of claim 18, wherein the feedback network comprises a series-connected resistor and capacitor.

20. The integrated circuit of claim 17, wherein the low impedance AC node is coupled to a first terminal of a capacitor, and wherein a second terminal of the capacitor is coupled to the fixed potential.

21. The integrated circuit of claim 17, wherein the semiconductor substrate comprises a group III-N semiconductor.

* * * * *